United States Patent
Lübbers et al.

(10) Patent No.: US 11,277,211 B2
(45) Date of Patent: Mar. 15, 2022

(54) METHODS AND APPARATUSES FOR POWER CONTROL

(71) Applicant: Andrew Wireless Systems GmbH, Buchdorf (DE)

(72) Inventors: Felix Lübbers, Augsburg (DE); Rainer Friedrich, Maihingen (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 67 days.

(21) Appl. No.: 16/531,781

(22) Filed: Aug. 5, 2019

(65) Prior Publication Data

US 2020/0099457 A1 Mar. 26, 2020

Related U.S. Application Data

(60) Provisional application No. 62/735,509, filed on Sep. 24, 2018.

(51) Int. Cl.
*H03G 3/00* (2006.01)
*H04B 17/10* (2015.01)
(Continued)

(52) U.S. Cl.
CPC .......... *H04B 17/103* (2015.01); *G01R 27/02* (2013.01); *H03F 1/0205* (2013.01); *H03F 1/32* (2013.01); *H03F 3/21* (2013.01); *H03G 3/3042* (2013.01)

(58) Field of Classification Search
CPC . H03F 1/0205; H03F 1/32; H03F 3/21; H03F 2200/211; H03F 2200/207;
(Continued)

(56) References Cited

U.S. PATENT DOCUMENTS 3,852,669 A 12/1974 Bowman et al.
4,122,400 A 10/1978 Medendorp et al.
(Continued)

FOREIGN PATENT DOCUMENTS

CN 203747758 U 7/2014
KR 900001068 B1 2/1990

OTHER PUBLICATIONS

"Exploring the Architectures of Network Analyzers", Agilent AN 1287-2 Application Note, at least as early as 2000, pp. 1-11, Agilent Technologies.
(Continued)

*Primary Examiner* — Khanh V Nguyen
*Assistant Examiner* — Khiem D Nguyen
(74) *Attorney, Agent, or Firm* — Fogg & Powers LLC

(57) ABSTRACT

A method comprises: measuring reflected and forward power at a power amplifier output; determining if the reflected power equals to or exceeds a first level; if the reflected power is equal to or exceeds the first level, then reduce power of a power amplifier input signal; determining if a standing wave ratio at the power amplifier output equals or exceeds a second level; if the standing wave ratio at the power amplifier output equals or exceeds the second level, then reducing the power amplifier input signal power level and/or sending an alarm; determining if the power amplifier output power equals or exceeds a third level; and if the power output from the power amplifier equals or exceeds the third level, then reducing the power amplifier input signal power level until such power level is less than or equal to the third level and/or sending an alarm.

29 Claims, 7 Drawing Sheets

(51) Int. Cl.
*G01R 27/02* (2006.01)
*H03F 1/02* (2006.01)
*H03F 1/32* (2006.01)
*H03F 3/21* (2006.01)
*H03G 3/30* (2006.01)

(58) Field of Classification Search
CPC ......... H03F 2200/465; H03F 2200/426; H03F 2200/451; H03F 3/189; H03F 1/52; H03F 3/24
USPC ...................... 330/278, 207 P, 298, 129, 127
See application file for complete search history.

(56) References Cited

U.S. PATENT DOCUMENTS

| | | |
|---|---|---|
| 4,353,037 A | 10/1982 | Miller |
| 5,994,965 A | 11/1999 | Davis et al. |
| 7,103,329 B1 | 9/2006 | Thon |
| 2001/0003433 A1 | 6/2001 | Hu et al. |
| 2004/0121742 A1 | 6/2004 | Abrams et al. |

OTHER PUBLICATIONS

Carbonini et al., "A Procedure to Evaluate the Output VSWR of High Power Amplifiers", 1998, pp. 241-244, IEEE.

Linear Technology, "LTC5583 Matched Dual-Channel 6GHz RMS Power Detector", at least as early as 2010, pp. 1-28, Linear Technology Corporation.

Wang et al., "Real Time Measurement of VSWR with Directional Couplers", 4th International Conference on Microwave and Millimeter Wave Technology Proceedings, 2004, pp. 719-722, IEEE.

International Searching Authority, "International Search Report and Written Opinion from PCT Application No. PCT/EP2019/075577", from Foreign Counterpart to U.S. Appl. No. 16/531,781, dated Dec. 17, 2019, pp. 1-14, Published: WO.

METHODS AND APPARATUSES FOR POWER CONTROL

CROSS-REFERENCE TO RELATED APPLICATIONS

The present application claims benefit of U.S. Patent Application Ser. No. 62/735,509, filed Sep. 24, 2018; the entire contents of the aforementioned patent application are incorporated herein by reference as if set forth in its entirety.

BACKGROUND

Transmitters are used in communications systems such as base stations and distributed antenna systems. Transmitters typically employ power amplifiers to boost the power of a transmitted signal.

In the event of an impedance match between the power amplifier and subsequent components such as a diplexer, duplexer, or antenna, the reflected energy may damage the power amplifier. To protect the power amplifier, an isolator such as a ferrite isolator may be inserted after the power amplifier. The isolator terminates reflected energy into a load rather then into the output of the power amplifier. Therefore, the isolator prevents the power amplifier from being damaged by excessive reflected energy.

Isolators, however, are costly, bulky, and have insertion loss. Isolator insertion loss reduces the effective power added efficiency of the transmitter's power amplifier. Therefore, there is a need for an alternative technique for protecting the power amplifier from excessive reflected power.

SUMMARY

A method is provided. The method comprises: measuring reflected power and forward power at an output of a power amplifier; determining if the reflected power is equal to or exceeds a first threshold level; if the reflected power is equal to or exceeds the first threshold level, then reduce power level of a signal at an input of the power amplifier; determining if a standing wave ratio at the output of the power amplifier equals or exceeds a second threshold level; if the standing wave ratio at the output of the power amplifier equals or exceeds a second threshold level, then perform at least one of: (a) reduce the power level of the signal at the input of the power amplifier, and (b) send an alarm; determining if the power output from the power amplifier is equal to or exceeds a third threshold level; and if the power output from the power amplifier is equal to or exceeds the third threshold level, then perform at least one of: (a) reduce the power level of the signal at the input of the power amplifier until such power level is less than or equal to the third threshold, and (b) send an alarm.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
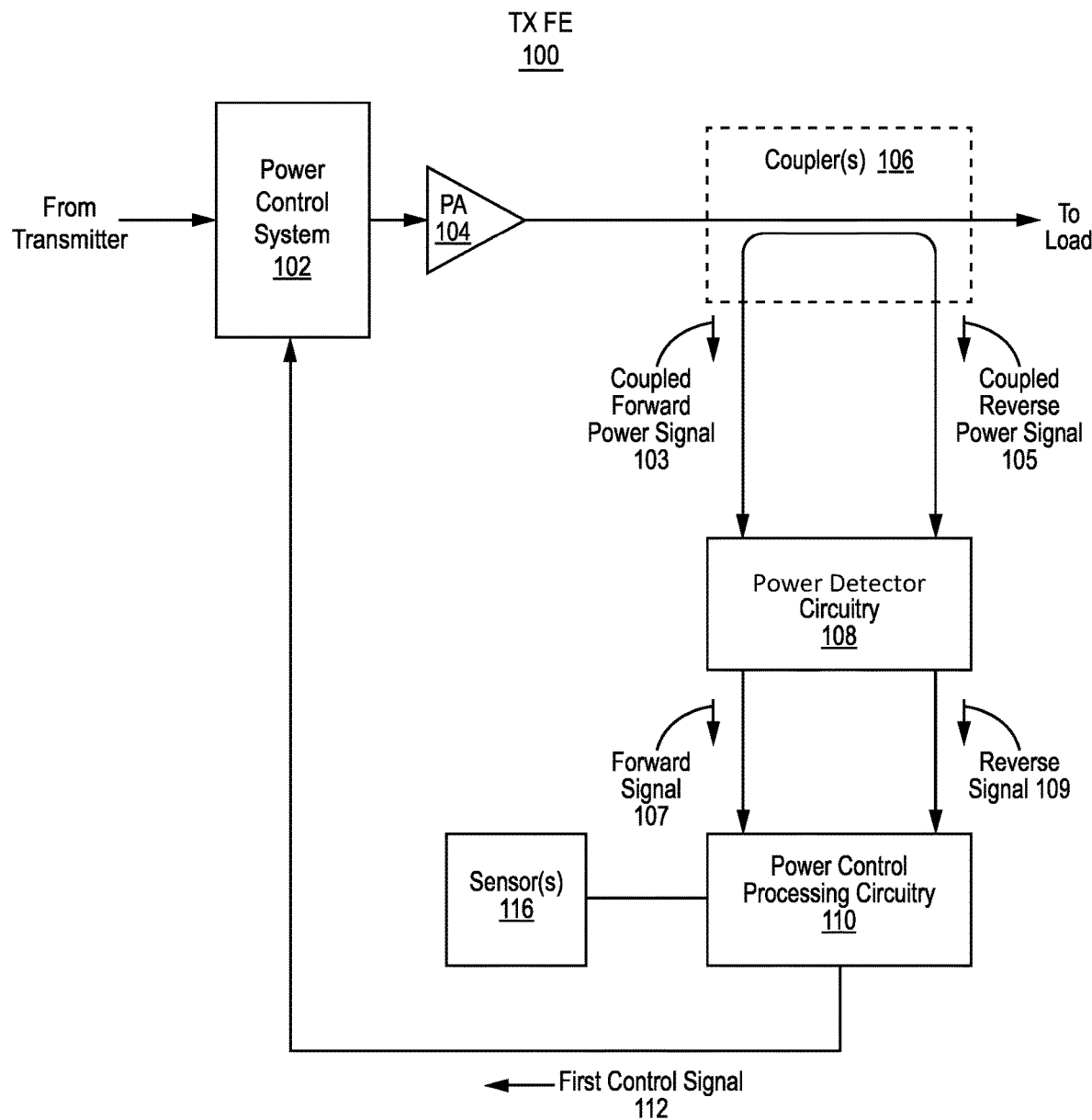
FIG. 1 illustrates a block diagram of one embodiment of a transmitter front end including a power amplifier with automatic limiting control and protection from reflected energy.

In the following detailed description, reference is made to the accompanying drawings that form a part hereof, and in which is shown by way of illustration specific illustrative embodiments. However, it is to be understood that other embodiments may be utilized and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

By eliminating the need for an isolator, embodiments described below provide techniques for reducing the cost and size of and enhancing the power added efficiency of a transmitter including a power amplifier. Such transmitters may be used in any system including communications systems such as broadcast transmitters for radio and television, cellular base stations, distributed antenna systems, and off-air repeaters.

FIG. 1 illustrates a block diagram of one embodiment of a transmitter front end including a power amplifier with automatic limiting control and protection from reflected energy (transmitter front end having a power amplifier limiting and protection system, or "TX FE") 100. In one embodiment, the transmitter front end having a power amplifier limiting and protection system 100 shares common components to implement both limiting and protection functions, and therefore eliminates a need for an isolator.

Automatic limiting control diminishes distortion in the power amplifier by adjusting a power level of a signal at the input of the power amplifier so that it does not equal or exceed a threshold level. If the power level equals or exceeds the threshold level, the power level would drive the power amplifier into saturation, and generate non-linear amplification including distortion products. Thus, the power amplifier would no longer operate as a linear power amplifier.

The transmitter front end having a power amplifier limiting and protection system 100 is configured to have a first input coupled to the output of a transmitter, and an output coupled to a load. The load may be an antenna. A diplexer, duplexer, or transmit receive switch may be coupled between the output port of the at least one coupler 106, and the antenna.

The transmitter front end having a power amplifier limiting and protection system 100 comprises a power control system 102, a power amplifier (PA) 104, at least one coupler (coupler(s)) 106, power detector circuitry 108, and power control processing circuitry 110. In one embodiment, the at least one coupler 106 is a bi-directional coupler. Optionally, the transmitter front end having a power amplifier limiting and protection system 100 includes at least one sensor (sensor(s)) 116.

The power amplifier 104 has an input coupled to an output of the power control system 102, and an output coupled to an input port of the at least one coupler 106. The power control system 102 is configured to vary the power level of the signal input into the power amplifier 104. The power control system 102 may be a variable attenuator and/or a variable gain amplifier.

The input of the power control system 102 is coupled to the output of the transmitter. An output port of the directional coupler 106 is coupled to a load.

The at least one coupler 106 couples a portion of the power incident at its input port ("forward power") to a forward coupled port. The amount of power provided at the forward coupled port is determined by a forward coupling factor between the input port and the forward coupled port. The at least one coupler 106 couples a portion of the power incident upon the output port ("reverse power" or "reflected power"), e.g. reflected from the load, to a reverse coupled port. The amount of power provided at the reverse coupled port is determined by an output coupling factor between the output port and the reverse coupled port. Each coupling factor is dependent upon the design of coupler design. The signal at the forward coupled port shall be referred to as coupled forward power signal 103, and its power level is proportional (e.g. linearly or logarithmically) to the level of the forward power. The signal at the reverse coupled port shall be referred to as the coupled reverse power signal 105, and power level is proportional (e.g. linearly or logarithmically) to the level of the reverse power.

The forward coupling port and the reverse coupling port of the at least one coupler 106 are coupled to inputs of the power detector circuitry 108. Thus, inputs of the power detector circuitry 108 are configured to receive the coupled reverse power signal 105 and the coupled forward power signal 103.

Optionally, a variable attenuator, e.g. having high and low attenuation states is inserted between the forward coupling port and the corresponding input of the power detector circuitry 108 and/or the reverse coupling port and the corresponding input of the power detector circuitry 108. The variable attenuator(s) each have an input coupled to the power control processing circuitry 110. The power control processing circuitry 110 sends a signal, as required, to vary, e.g. dither, the attenuation level of the attenuator(s) so as to extend the dynamic range of the power detector circuitry 108.

Optionally, the power detector circuitry 108 detects root mean square power. In one embodiment, the power detector circuitry 108 is implemented with Analog Devices, Inc.'s LTC5583 matched dual channel power detector. However, the power detector circuitry 108 may be otherwise implemented. The power detector circuitry 108 generates two signals; a forward signal 107 that is proportional (e.g. linearly or logarithmically) to forward power, and a reverse signal 109 is proportional (e.g. linearly or logarithmically) to reverse power.

Each of the signals generated by the power detector circuitry 108, the power control processing circuitry 110, and/or the at least one sensor 116 and described herein may be analog or digital signals, and voltage or current signals. For pedagogical reasons, such signals will be illustrated as analog voltage signals, and may be referred to as voltages or voltage signals.

The outputs of the power detector circuitry 108 are coupled to inputs of the power control processing circuitry 110. Thus, the inputs of power control processing circuitry 110 are configured to receive the forward voltage and reverse voltage generated by the power detector circuitry 108. The power control processing circuitry 110 has an output configured to provide a first control signal 112 generated by the power control processing circuitry 110 to prevent the amplifier 104 from:

a. being damaged by a level of reflected power at the output of the power amplifier 104 over a short period of time;

b. being damaged by due to prolonged exposure to a high level of reflected power that is less then the level that would damage the power amplifier during the short period of time; and c. saturating.

A second input of the power control system 102 is coupled to the output of the power control processing circuitry 110. Thus, the power control system 102 is configured to receive the first control signal 112. The power control system 102 uses the first control signal 112 to adjust its attenuation and/or gain, and thus control the power level of the signal provided to the input of the power amplifier 104.

The power control processing circuitry 110 is configured to adjust the gain and/or attenuation of the power control system 102 to quickly reduce power levels of signals provided at the input of the power amplifier 104 upon the reverse power becoming too high, e.g. upon a level of the reverse signal level exceeding a first threshold level. Typically, the attenuation is increased or the gain is reduced by a large amount, e.g. respectively to a maximum or minimum level. This prevents excessive level of reflected power from damaging the power amplifier 104 over a short time period, e.g. 1-10 microseconds. Such control is relatively fast, and may be abrupt.

The power control processing circuitry 110 is also configured to adjust the gain and/or attenuation of the power control system 102 to prevent the power amplifier 104 from:

(a) being damaged due to prolonged exposure, e.g. greater than 500 milliseconds, to a high level of reflected power (but not high enough to engage the aforementioned fast control) indicated by a high standing wave ratio (SWR) (at the output port of the at least one coupler 106) that is equal to or greater than a second threshold value, e.g. greater than 2:1; or (b) saturating indicated by a high forward voltage level exceeding a third threshold level. Such control is relatively slow. With respect to at least saturation prevention, the gain and/or attenuation changes are typically incremental and not be abrupt.

With respect to the high standing wave ratio mentioned above, the adjustment to prevent damage due to the high SWR is based upon a linear or non-linear function of SWR. SWR equals $$\frac{(1 + \sqrt{Pr/Pf})}{(1 - \sqrt{Pr/Pf})},$$

where Pr and Pt are respectively reflected power and forward power. Reflected power and forward power are related to respectively the reverse voltage and the forward voltage generated by the power detector circuitry 108. Thus, SWR may be calculated using the reverse voltage and forward voltage values.

For example, if the SWR increases from below 2:1 to 2.5:1 and the second threshold level is a SWR of 2:1, then the attenuation is increased (or the gain is decreased) by a fixed amount, e.g. about 7 decibels (for example from ten percent to fifty percent). For example, if the SWR increases from below 2.25:1 to 2.5:1 and the second threshold level is a SWR of 2.25:1, then the attenuation is increased (or the gain is decreased) by a fixed amount, e.g. about 4.8 decibels (for example from ten percent to thirty percent). Note, that as the second threshold level increases, the attenuation level drops for a given SWR. Optionally, the second threshold level will be less than the first threshold level.

Optionally, the second threshold level may be a linear and/or non-linear function of one or more parameters. For example, if the reflected power level is below a reflected power threshold level due to the forward power level being below a forward power threshold level, then the reflected power will not damage, even over an extended period of time, the power amplifier 104. Whether the reflected power level is below the reflected power threshold level may be ascertained by determining if the forward voltage level is below a forward voltage threshold level and/or the reverse voltage level is below a reverse voltage threshold level. Thus, for example, the second threshold level may be a function of the forward voltage level and/or the reverse voltage level. Typically, the second threshold level will be increased if the forward voltage level is below a forward voltage threshold level and/or the reverse voltage level is below a reverse voltage threshold level. The second threshold level may be increased sufficiently high to effectively disable the control loop for protecting the power amplifier 104 against prolonged exposure to a high level of reflected power, but only while the forward voltage level is below a forward voltage threshold level and/or the reverse voltage level is below a reverse voltage threshold level.

To prevent saturation of the power amplifier 104, the adjustment of the power control processing system is based upon a linear or non-linear function of the forward voltage. The forward voltage is proportional to the level of the forward power, and thus is related to the power level at the input of the power amplifier 104. The power control system 102 is adjusted when the forward voltage is equal to or exceeds a third threshold level. The attenuation or gain of the power control system 102 is respectfully increased or diminished until the forward voltage is less than or is equal to the third threshold level. Optionally, the third threshold level corresponds to an output power level of the power amplifier 104 at or below the output power level at which the power amplifier 104 saturates. Also, the first threshold level, the second threshold level, and/or the third threshold level may be either stored in and/or generated by the power control processing circuitry 110. Further, the first threshold level, the second threshold level, and/or the third threshold level may be determined from testing the corresponding power amplifier 104, and/or performing mathematical analysis.

Optionally, at least one sensor (sensor(s)) 116 is coupled to the power control processing circuitry 110. The at least one sensor 116 may be used to adjust the first control signal 112 based upon parameter measurement(s) made by the sensor(s) 116. As will be subsequently illustrated, in one embodiment, one of the at least one sensor 116 may be a temperature sensor. However, other sensor(s), such as humidity sensor(s), may be used.

The power control processing circuitry 110 may be implemented with analog and/or digital circuitry. For example, the power control processing circuitry 110 may be implemented with solely electronic analog circuitry, including circuitry used to implement electronic analog computers. Alternatively, the power control processing circuitry 110 may be implemented with a mixture of analog and digital circuitry. One embodiment of a power control processing circuitry 110 using a both analog and digital circuitry will now be described.

Figure 2:
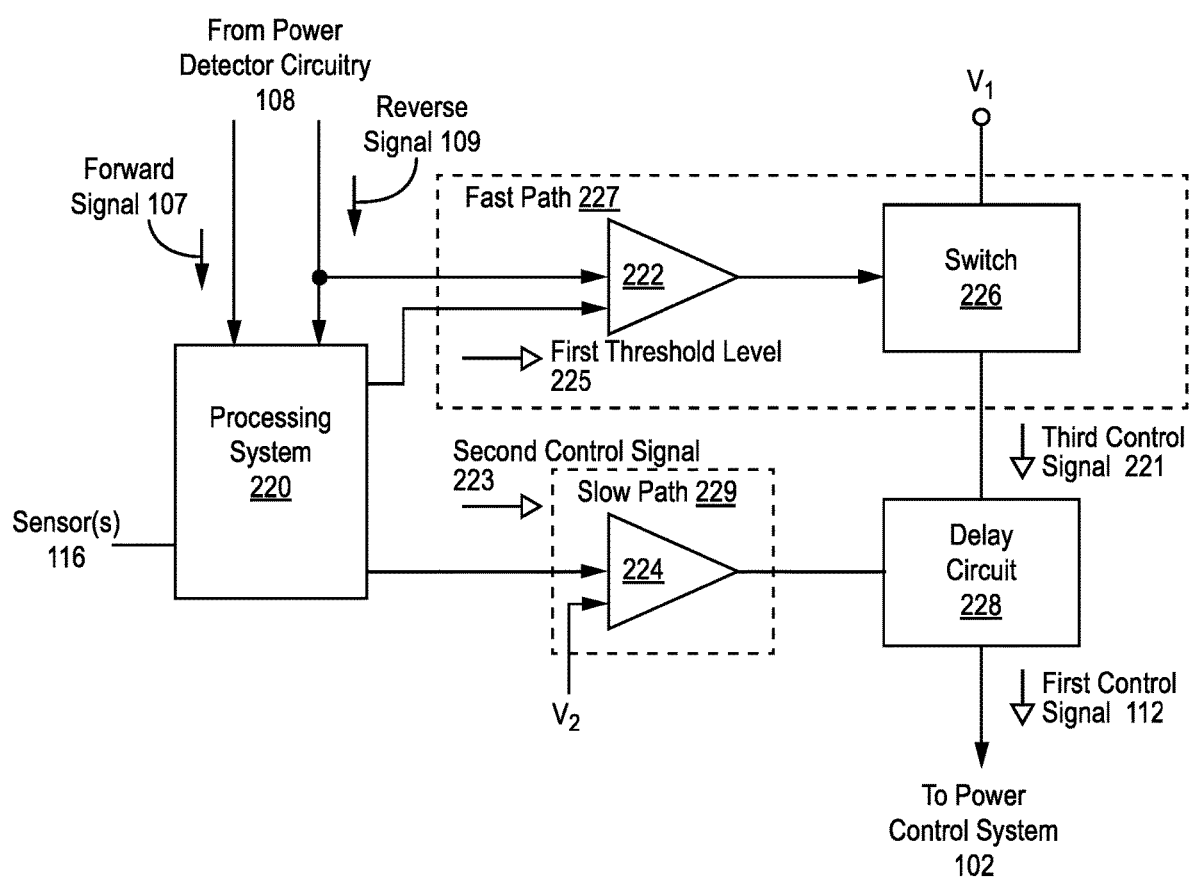
FIG. 2 illustrates a block diagram of one embodiment of the power control processing circuitry.

FIG. 2 illustrates a block diagram of one embodiment of the power control processing circuitry 210. The illustrated power control processing circuitry 210 comprises a processing system 220, a comparator 222, and a switch 226. Optionally, the power control processing circuitry 210 includes an amplifier 224 and/or a delay circuit 228. Optionally, the processing system 220 is configured to be coupled to the at least one sensor 116, e.g. a temperature sensor.

The processing system 220 is coupled to the power detector circuitry 108 and configured to receive the forward signal 107 and the reverse signal 109. The processing system 220 generates and/or stores a first threshold level, e.g. a first threshold voltage level. The first threshold level 225 is coupled from a first output of the processing system 220 to a first input of the comparator 222. A second input of the comparator 222 is coupled to the power detector circuitry 108 and is configured to receive the reverse signal 109.

Normally, the first control signal 112 is determined by a subsequently described second control signal 223. The second control signal 223 is generated using the techniques described herein to prevent the power amplifier 104 from saturating or from being damaged from prolonged exposure to a high reflected power. However, if the voltage level of the reverse signal 109 becomes larger than the first threshold level 225, the switch 226 changes from a first state (off or on) to a second state (on or off) generating a third control signal 221. Then, the first control signal 112 is determined by substantially the voltage at a first port of the switch 226, e.g. the third control signal 221. After a delay period, the switch 226 returns to the first state from the second state, and the first control signal 112 is again determined by the second control signal 223.

The operation of the switch 226 will now be described. The comparator 222 generates, at the output of the comparator 222, a binary output depending upon whether or not the voltage level of the reverse signal 109 exceeds the first threshold level 225. The output of the comparator 222 is coupled to a control port of the switch 226, e.g. a transistor or a relay. Optionally, the switch 226 has a second port coupled to a voltage, $V_1$. If the reverse voltage exceeds the first threshold level 225, then switch 226 is actuated, e.g. turned on or off, generating a signal having a voltage level of $V_1$ at a first port that is the first control signal 112. The first control signal 112 having a voltage level of $V_1$ causes the power control system 102 to increase or reduce, e.g. by a large amount, respectively its attenuation or gain; for example, the attenuation or gain may be respectively increased to a maximum level or decreased to a minimum level. In one embodiment, the switch 226 is an N-channel Enhancement mode Metal Oxide Semiconductor Field Effect Transistor (MOSFET) such as ON Semiconductor Corporation's model number BSS138; the gate, drain, and source of the MOSFET would be coupled respectively to the output of the comparator 222, the first control signal 112 (or optionally the delay circuit), and voltage $V_1$.

The state of the switch 226 reverses, e.g. respectively to off or on, either after the voltage level of the reverse signal 109 is equal to or less than the first threshold level 225 or (optionally) if the switch is other wise disabled as will be subsequently illustrated.

The first threshold level 225 is a constant. Optionally, the first threshold voltage level is variable, and a function of parameters, e.g. measured by the at least one sensor 116. One such parameter is ambient temperature of the environment around the power amplifier 104; the ambient temperature would be measured by a temperature sensor coupled to the processing system 220. Such a temperature sensor may be a thermistor, thermocouple, and/or a resistance temperature detector.

The first threshold level 225 from the processing system 110 only changes as such parameters change. Ambient temperature typically changes relatively slowly over time, and thus may be treated as a constant.

The above-described control path may be referred to as a "fast path" 227 because all processing is performed in substantially in real time based upon the operation of the power detector circuitry 108, the first comparator 112, and the switch 114. For the above described reasons, typically the first threshold level 225, even if a function of parameter(s) such as temperature, may be treated as a constant. The fast path 227 is sufficiently fast to prevent large levels of reflected power from damaging the power amplifier 104 within a short time period, e.g. due to power spikes from complex modulated signals in LTE and UMTS.

At cold or hot temperatures, unlike normal ambient temperature ranges (e.g. zero to forty degrees Celsius), the power amplifier 104 may be susceptible to damage from lower or higher levels of reflected power. Thus, the first threshold voltage level may be varied, e.g. reduced and/or increased, linearly or non-linearly as the case may be, as the temperature varies. For example, the first threshold level 225 may be decreased when the temperature is below a first threshold temperature and/or above a second threshold temperature.

An optional embodiment for implementing the first threshold level 225 as function of such ambient temperature will now be described. The power amplifier 104 would have been previously analyzed over a wide range of temperatures to determine at various temperatures the level of reflected power that will damage the power amplifier 104 instantaneously or over a short time period. Using such measurements, first threshold voltages (versus temperature) are determined, and may be represented by a function and/or look up table. For example curve fitting techniques can be used to determine the function, or interpolation techniques can be used to determine the look up table based upon limited data measurements. The function may be a linear and/or non-linear function.

The function and/or look up table for generating the first threshold level 225 may be programmed into, e.g. memory circuitry of, the processing system 220. Similarly, function(s) and/or look up table(s) for generating a second control signal 223 may be programmed into, e.g. memory circuitry, of the processing system 220. Such a second control signal 223 is provided at a second output of the processing system 220. The function(s) may be a linear and/or non-linear function, and be dependent upon parameter values, e.g. temperature, measured by sensor(s) 116.

The first control signal is determined by the second control signal 223 when the switch 226 is not activated (e.g. when the reverse signal 109 is less than or equal to the first threshold level 225) by the comparator 222. Optionally, the second control signal 223 is amplified by the amplifier 224. The amplifier 224 may be an operational amplifier having a first input configured to receive the second control signal 223, and a second input configured to receive a voltage, $V_2$. The amplifier 224 provides an amplified second control signal at its output which is the first control signal 112 if the switch 226 has not been activated as described above. The above-described control path may also be referred to as a "slow path" 229 because signals from the power detector circuitry 108 must be processed by the processing system 220, and thus processing is not performed in substantially in real time.

Optionally, the output of the amplifier 224 and the first port of the switch 226 are coupled to a delay circuit 228. The delay circuit 228 is configured to:

(a) cause, for a first time period after DC power is supplied to the power amplifier 104, the power control system 102 to, e.g. highly, attenuate the power level of the signal at the input of the power amplifier 104 to prevent excessive reflected power from damaging the power amplifier 104 over a short time period; and/or (b) prevent rapid dithering between the fast path 227 and the slow path 229.

For example, once the fast path 227 has been activated the delay circuit 228 prevents the slow path 229 from being activated until a fixed period of time, e.g. between 200 and 3000 microseconds, has passed. When the fast path 227 is activated, the attenuation or gain of the power control system 102 is set respectively to a high or low level. The delay circuit 228 delays activation of the slow path 229 (and hence deactivation of the fast path 227) to ensure protection of the power amplifier 104. Thus, the fast path 227 (and the third control signal 221) is prioritized over the slow path 229.

The functionality of the delay circuit 228 can be otherwise implemented in the power control processing circuitry 218 without the use of the delay circuit 228; for example, an optional sensor, e.g. voltage sensor, can be coupled to the first port of the switch 226 and to the processing system 220. The sensor can measure, e.g., the voltage at the first port of the switch 226, and convey that measurement to an input of the processing system 220. When the processing system 220 detects that the fast path has been activated, the processing system 220 can adjust, e.g. decrease, the amplitude of the second control signal 223 so that it has the same level than the third control signal 221 for a finite period of time.

In one embodiment, the processing system 220 comprises processor circuitry, such as a microcontroller integrated circuit, coupled to memory circuitry. Optionally, the processing system 220 may include analog to digital converter(s) and/or digital to analog converter(s) if any of such converters are required but are not included in the processor circuitry. Optionally, such analog to digital converter(s) would be coupled to input(s) of the processing system 220 to convert analog signals to digital signals, and such digital to analog converter(s) would be coupled to output(s) of the processing system to convert digital signals to analog signals.

Figure 3:
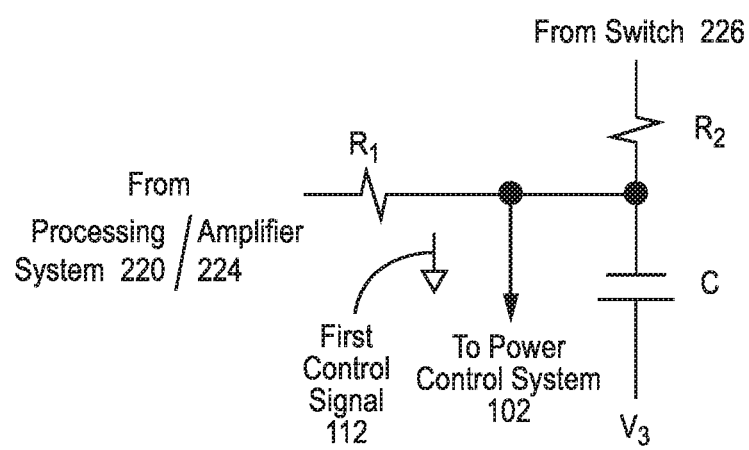
FIG. 3 illustrates a schematic diagram of one embodiment of the delay circuit.

FIG. 3 illustrates a schematic diagram of one embodiment of the delay circuit 328. The delay circuit 328 comprises a first resistor $R_1$, and a capacitor C. The first port of the switch 226 is coupled to a first port of the first resistor $R_1$, a first port of the capacitor C, and the second input of the power control system 102. A second port of the capacitor C is coupled to a third voltage $V_3$. A second port of the first resistor $R_1$ is coupled to the output of the processing system 220 or the optional amplifier 224. Optionally, the switch 226 is an enhancement mode MOSFET such as the one described above.

The values of the first resistor $R_1$ and the capacitor C are selected to protect the power amplifier 104 when the transmitter front end having a power amplifier limiting and protection system 100 is powered on. The time constant of the first resistor $R_1$ and capacitor C cause the first control signal 112, for an associated period of time delay, to have a voltage level, increasing from a low voltage level such as zero volts, that causes the power control system 102 to gradually decrease attenuation level or increase gain level from respectively a high attenuation level or a low gain level, such as maximum attenuation or minimum gain. This prevents the power amplifier 104 from being damaged if the reverse power is initially too high. Optionally, the first resistor $R_1$ has a resistance of between 10 Kohms and 100 Kohms, and the capacitor C has a capacitance of between 3.9 nFarads and 10 nFarads.

Optionally, the delay circuit 328 includes a second resistor $R_2$ that is used to limit current through the switch 226. If the second resistor $R_2$ is used, then the second resistor $R_2$ is inserted between the first port of the switch 226, and the first port of the first resistor $R_1$, the first port of the capacitor C, and the second input of the power control system 102. Optionally, the first voltage $V_1$, the second voltage $V_2$, and the third voltage $V_3$ are respectively zero volts, zero volts, and zero volts. However, the first voltage $V_1$, the second voltage $V_2$, and/or the third voltage $V_3$ may be different voltages then those previously mentioned. Optionally, the second resistor $R_2$ has a value of about 100 ohms.

The resistance value of $R_2$ must be much less than the resistance value of $R_1$ to ensure that the delay circuit 228 delays activation of the slow path 229 (and hence deactivation of the fast path 227). For example, $R_1$ must be at least one hundred times larger than $R_2$.

Optionally, V1 and V3 are respectively zero volts and zero volts. In such a case, if the level of the reverse voltage exceeds the first threshold level 225, then the comparator 222 generates a voltage level, e.g. greater than three volts, capable of changing a state of the switch 226, e.g. from open to closed (or vice versa). In this condition, the capacitor C discharges and the voltage across the capacitor decreases, e.g. to a level where the power control system 102 set the attenuation to maximum or gain to minimum. The discharge time is relatively quick being based upon a time constant determined by multiplying the capacitance value of capacitor C and the combination of resistances of the MOSFET and, if used, the optional second resistor R2.

When the level of the reflected power declines, the level of the reverse voltage also declines. If the level of the reverse voltage is less than the first threshold level 225, the switch 226 resets, i.e. returns to its original state (from closed to open or vice versa) and the output voltage of the amplifier 224 is able to charge capacitor C so that the first control signal 112 is again determined by the second control signal 223. The time to charge or recharge the capacitor is dependent upon the capacitance value of capacitor C and the resistance value of R1.

The power amplifier control and protection techniques and features described above can be implemented in various types of systems, e.g. communications systems. For example, the power amplifier control and protection techniques and features described above can be implemented in various types of repeater systems. Repeater systems can be implemented in various ways.

Figure 4A:
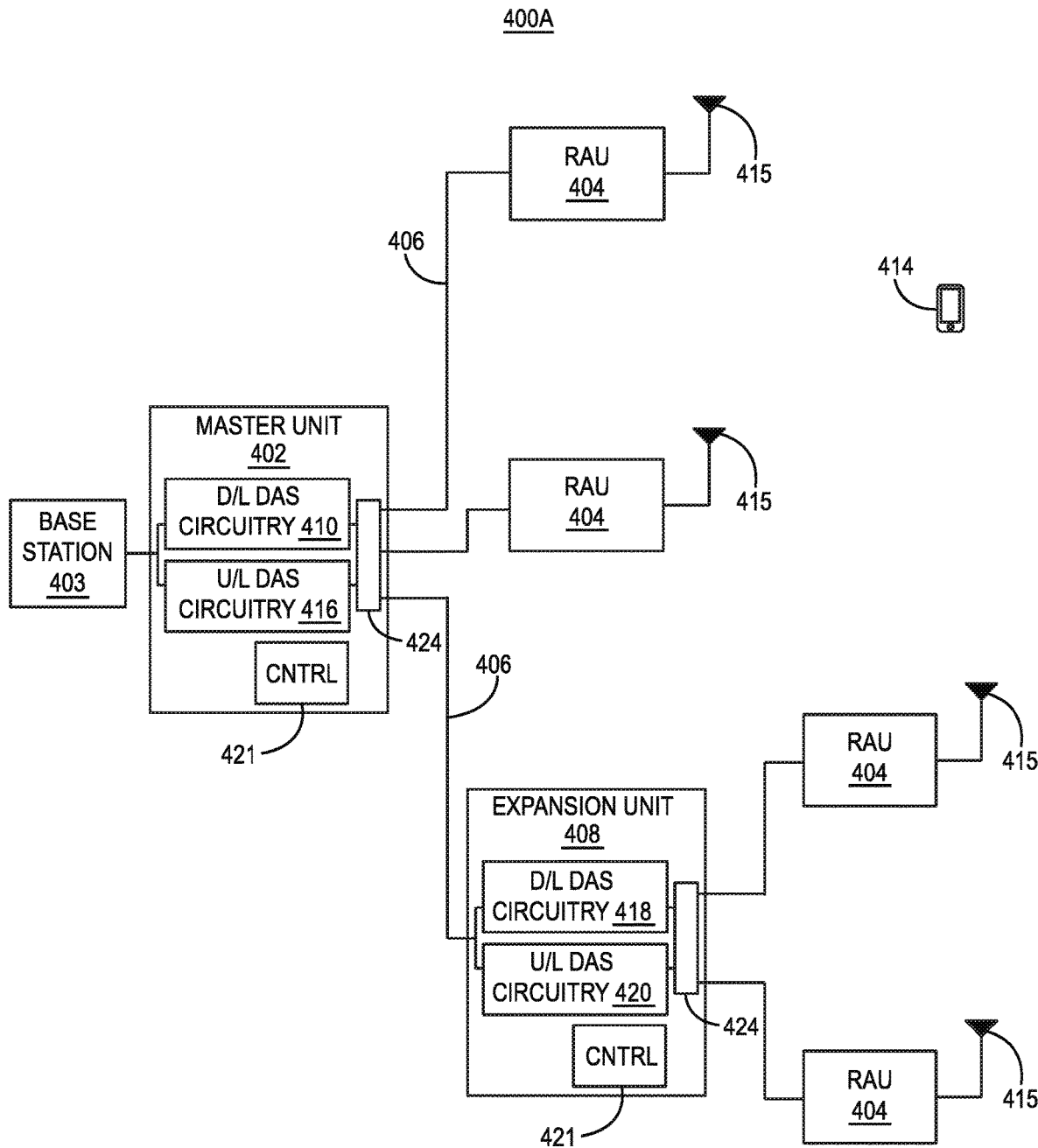
FIG. 4A illustrates a block diagram of one embodiment of a distributed antenna system in which power amplifier control and protection techniques are implemented.

For example, a repeater system can be implemented as a distributed antenna system (DAS). FIG. 4A illustrates a block diagram of one embodiment of a distributed antenna system 400A in which the power amplifier control and protection techniques described herein are implemented.

The DAS 400 comprises one or more master units 402 that are communicatively coupled to one or more remote antenna units (RAUs) 404 via one or more waveguides 406, e.g. optical fibers or cables. Each remote antenna unit 404 can be communicatively coupled directly to one or more of the master units 402 or indirectly via one or more other remote antenna units 404 and/or via one or more expansion (or other intermediary) units 408. Each RAU 204 is configured to be coupled to one or more antennas 415. However, in an alternative embodiment, a RAU may include the one or more antennas.

The DAS 400 is coupled to one or more base stations 403 and is configured to improve the wireless coverage provided by the base station(s) 403. The capacity of each base station 403 can be dedicated to the DAS or can be shared among the DAS and a base station antenna system that is co-located with the base station and/or one or more other repeater systems.

In the embodiment shown in FIG. 4A, the capacity of one or more base stations 403 are dedicated to the DAS 400 and are co-located with the DAS 400. The base station(s) 403 are coupled to the DAS 600. It is to be understood however that other embodiments can be implemented in other ways. For example, the capacity of one or more base stations 403 can be shared with the DAS 400 and a base station antenna system co-located with the base station(s) 403 (for example, using a donor antenna). The base station(s) 403 can include one or more base stations that are used to provide commercial cellular wireless service and/or one or more base stations that are used to provide public and/or private safety wireless services (for example, wireless communications used by emergency services organizations (such as police, fire and emergency medical services) to prevent or respond to incidents that harm or endanger persons or property).

The base station(s) 403 can be coupled to the master units 402 using a network of attenuators, combiners, splitters, amplifiers, filters, cross-connects, etc., (sometimes referred to collectively as a "point-of-interface" or "POI"). This network can be included in the master units 402 and/or can be separate from the master units 402. This is done so that, in the downlink, the desired set of RF channels output by the base station(s) 403 can be extracted, combined, and routed to the appropriate master units 402, and so that, in the upstream, the desired set of carriers output by the master units 402 can be extracted, combined, and routed to the appropriate interface of each base station 403. It is to be understood, however, that this is one example and that other embodiments can be implemented in other ways.

In general, each master unit 402 comprises downlink (D/L) DAS circuitry 410 that is configured to receive one or more downlink signals from one or more base stations 403. Each base station downlink signal includes one or more radio frequency channels used for communicating in the downlink direction with user equipment 414 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORP") protocol, the Open Base Station Standard Initiative ("OBSAI") protocol, or other protocol). The downlink DAS circuitry 410 in each master unit 402 is also configured to generate one or more downlink transport signals derived from one or more base station downlink signals and to transmit one or more downlink transport signals to one or more of the remote antenna units 404.

Each RAU 404 is configured to receive the downlink transport signals transmitted to it from one or more master units 402 and to use the received downlink transport signals to generate one or more downlink radio frequency signals that are radiated from one or more antennas associated with that remote antenna unit 404 for reception by user equipment 414. In this way, the DAS 400A increases the coverage area for the downlink capacity provided by the base station(s) 403.

Also, each RAU 404 is configured to receive one or more uplink radio frequency signals transmitted from the user equipment 414. These signals are analog radio frequency signals.

Each RAU 404 is also configured to generate one or more uplink transport signals derived from the one or more remote uplink radio frequency signals and to transmit one or more uplink transport signals to one or more of the master units 402.

Each master unit 402 comprises an uplink (U/L) DAS circuitry 416 that is configured to receive the respective uplink transport signals transmitted to it from one or more RAUs 404 and to use the received uplink transport signals to generate one or more base station uplink radio frequency signals that are provided to the one or more base stations 403 associated with that master unit 202. Typically, this involves, among other things, combining or summing uplink signals received from multiple RAUs 404 in order to produce the base station signal provided to each base station 203. In this way, the DAS 400 increases the coverage area for the uplink capacity provided by the base stations 203.

Each expansion unit 408 comprises a downlink DAS circuitry 418 that is configured to receive the downlink transport signals transmitted to it from the master unit 402 (or another expansion unit 408) and to transmit the downlink transport signals to one or more RAUs 404 or other downstream expansion units 408. Each expansion unit 408 also comprises an uplink DAS circuitry 420 that is configured to receive the respective uplink transport signals transmitted to it from one or more RAUs 404 or other downstream expansion units 408, combine or sum the received uplink transport signals, and transmit the combined uplink transport signals upstream to the master unit 402 or another expansion unit 408. In other embodiments, one or more remote antenna units 404 are coupled to one or more master units 402 via one or more other remote antenna units 404 (for example, where the remote antenna units 404 are coupled together in a daisy chain or ring topology).

The downlink DAS circuitry 410, 418 and the uplink DAS circuitry 416, 420 can comprise one or more of appropriate connectors, attenuators, combiners, splitters, amplifiers, filters, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the respective downlink and uplink DAS circuitry in each of the master units 402 and expansion units 408 may share common circuitry and/or components.

The DAS 400 can use digital transport, analog transport, or combinations of digital and analog transport for generating and communicating the transport signals between the master units 402, the remote antenna units 404, and any expansion units 408. Each master unit 402 and expansion unit 408 in the DAS 400 also comprises a respective controller (CNTRL) 412 (or controller circuitry). The controller 412 is implemented using one or more programmable processors that execute software that is configured to implement the various control functions. Optionally, the power control processing circuitry 210 or processing system 220 may be part of one or more controllers 412.

In embodiments of the invention described herein, certain components, e.g. processing circuitry, power detection circuitry, look up tables, and components thereof, are illustrated as being incorporated in a specific section of a communications system, e.g. a RAU of a DAS. However, such components may be located in other sections of the corresponding communications system, e.g. in a master unit, expansion unit, and/or a base station.

Figure 4B:
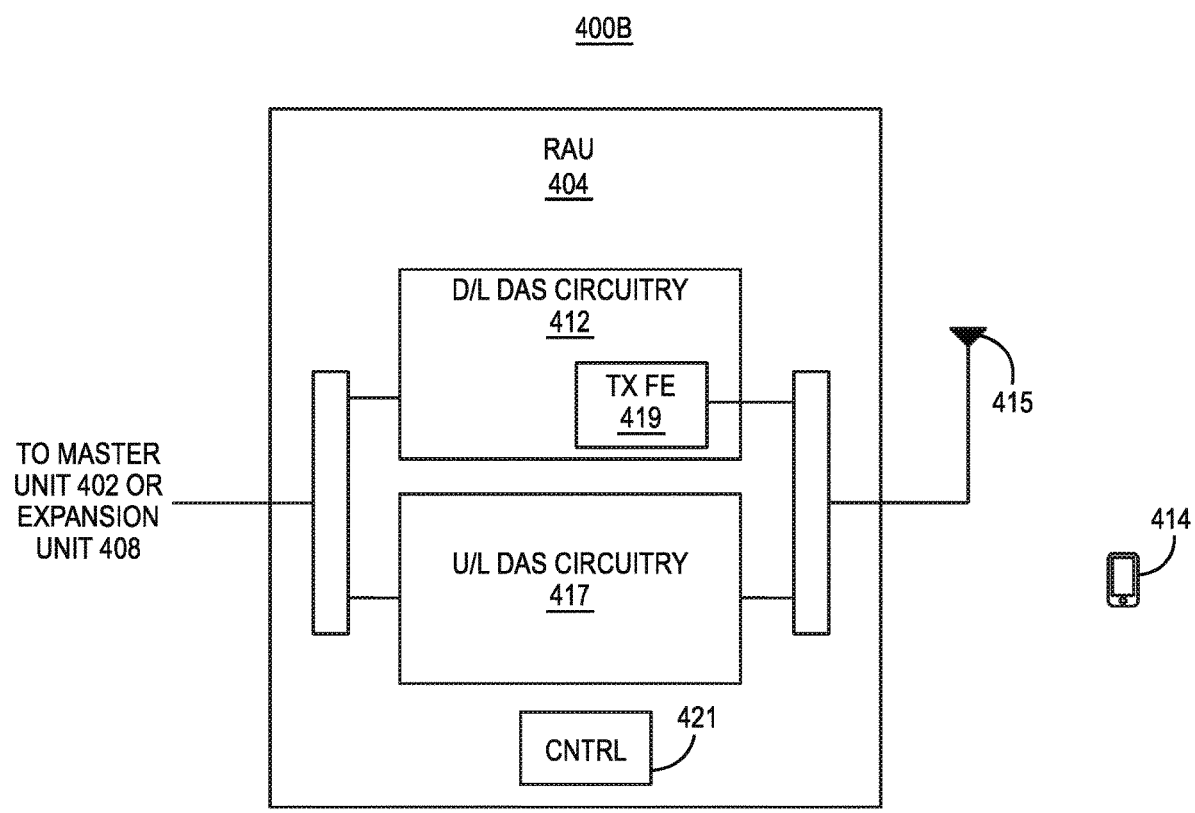
FIG. 4B illustrates a block diagram one embodiment of a remote antenna unit in which the power amplifier limiting and protection techniques are implemented.

FIG. 4B illustrates a block diagram of one embodiment of a remote antenna unit 400B in which the power amplifier limiting and protection system techniques described herein are implemented. Each remote antenna unit 404 comprises downlink DAS circuitry 412 that is configured to receive the downlink transport signals transmitted to it from one or more master units 402 and to use the received downlink transport signals to generate one or more downlink radio frequency signals that are radiated from one or more antennas 415 associated with that remote antenna unit 404 for reception by user equipment 414. In this way, the DAS 400 increases the coverage area for the downlink capacity provided by the base stations 403. The downlink DAS circuitry 412 of each RAU 404 includes at least one transmitter front end having a power amplifier limiting and protection system 419 which, for example, power amplifies the downlink radio frequency signals.

Also, each remote antenna unit 404 comprises uplink DAS circuitry 417 that is configured to receive one or more uplink radio frequency signals transmitted from the user equipment 414. These signals are analog radio frequency signals.

The uplink DAS circuitry 417 in each remote antenna unit 404 is also configured to generate one or more uplink transport signals derived from the one or more remote uplink radio frequency signals and to transmit one or more uplink transport signals to one or more of the master units 402. The uplink DAS circuitry 417 of each RAU 404 may include at least one receiver front end which e.g. amplifies received remote uplink radio frequency signals.

Returning to FIG. 4A, each master unit 402 comprises uplink DAS circuitry 416 that is configured to receive the respective uplink transport signals transmitted to it from one or more remote antenna units 404 and to use the received uplink transport signals to generate one or more base station uplink radio frequency signals that are provided to the one or more base stations 403 associated with that master unit 402. Typically, this involves, among other things, combining or summing uplink signals received from multiple remote antenna units 404 in order to produce the base station signal provided to each base station 403. In this way, the DAS 400 increases the coverage area for the uplink capacity provided by the base stations 403.

Each expansion unit 408 comprises downlink DAS circuitry 418 that is configured to receive the downlink transport signals transmitted to it from the master unit 402 (or other expansion unit 408) and transmits the downlink transport signals to one or more remote antenna units 404 or other downstream expansion units 408. Each expansion unit 408 also comprises uplink DAS circuitry 420 that is configured to receive the respective uplink transport signals transmitted to it from one or more remote antenna units 404 or other downstream expansion units 608, combine or sum the received uplink transport signals, and transmit the combined uplink transport signals upstream to the master unit 402 or other expansion unit 408. In other embodiments, one or more remote antenna units 404 are coupled to one or more master units 402 via one or more other remote antenna units 404 (for example, where the remote antenna units 404 are coupled together in a daisy chain or ring topology).

The downlink DAS circuitry (D/L DAS circuitry) 410, 412, and 418 and uplink DAS circuitry (U/L DAS circuitry) 416, 417, and 420 in each master unit 402, remote antenna unit 404, and expansion unit 408, respectively, can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry 410, 412, and 418 and uplink DAS circuitry 416, 417, and 420 may share common circuitry and/or components.

The DAS 400 can use digital transport, analog transport, or combinations of digital and analog transport for generating and communicating the transport signals between the master units 402, the remote antenna units 404, and any expansion units 408. Each master unit 402, remote antenna unit 404, and expansion unit 408 in the DAS 400 also comprises a respective controller (CNTRL) 421. The controller 421 is implemented using one or more programmable processors that execute software that is configured to implement the various control functions. The controller 421 (more specifically, the various control functions implemented by the controller 421) (or portions thereof) can be implemented in other ways (for example, in a field programmable gate array (FPGA), application specific integrated circuit (ASIC), etc.). Components of the power amplifier limiting and protection system 100, e.g. the power control processing circuitry 110 or a portion thereof, may be incorporated in, e.g. the controller 421 of a remote antenna unit 404 or in another controller 421 or state machine incorporated into the distributed antenna system 400.

The at least one transmitter front end having a power amplifier limiting and protection system 419 includes at least one of the transmitter front end having a power amplifier limiting and protection system 100 described above. Further, a combination of one or more diplexers, duplexers, transmit/receive switches duplexers and/or other combiner systems can be used to couple the downlink DAS circuitry 412 (e.g. including the at least one transmitter front end 419) and the uplink DAS circuitry 417 to one or more antennas 415. The transmitter front end having a power amplifier limiting and protection system 100 may be incorporated, e.g. in the controller 421 of a remote antenna unit 404 or in another controller 421 otherwise incorporated into the distributed antenna system 600.

Figure 5:
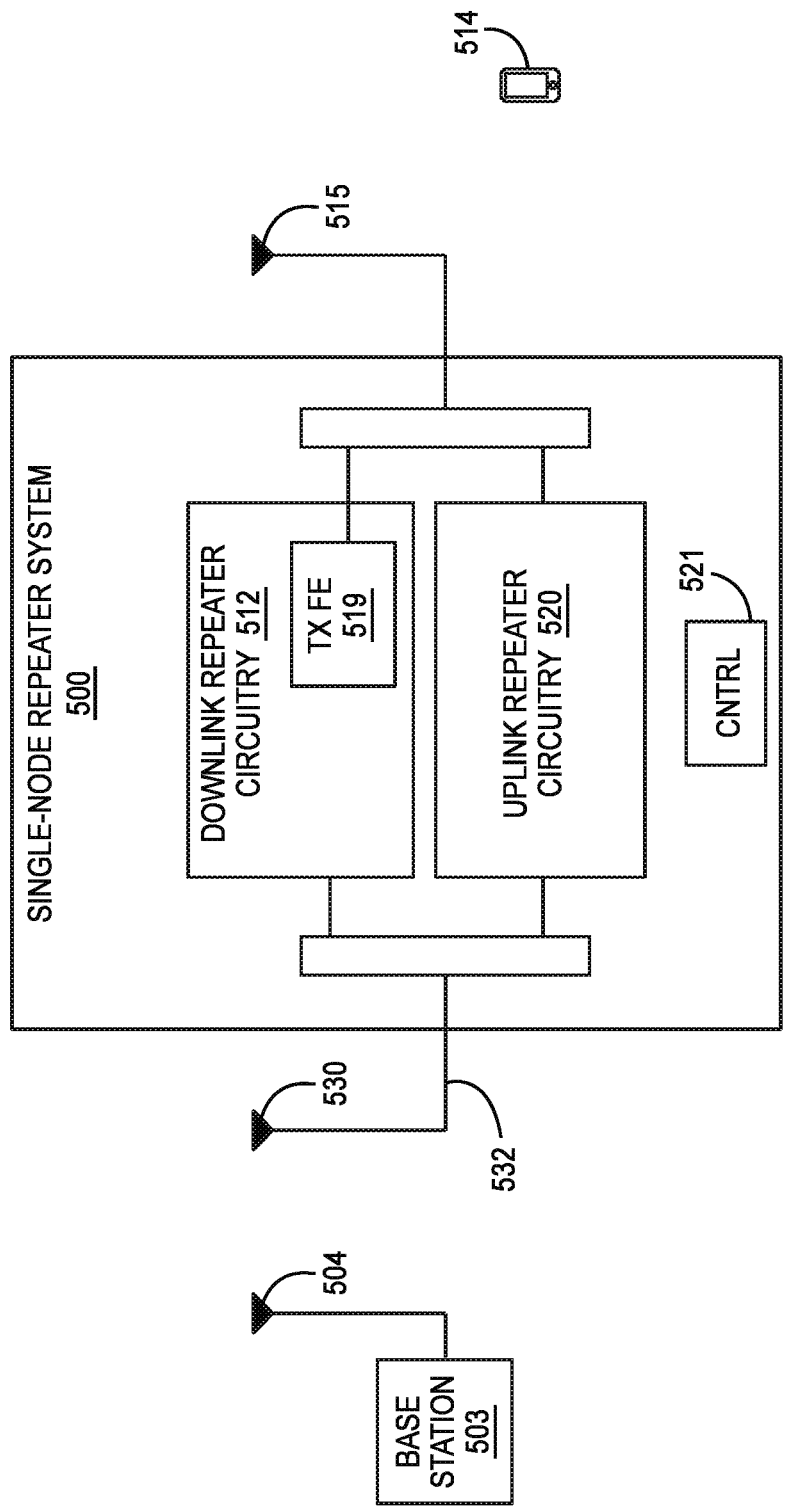
FIG. 5 illustrates a block diagram of one embodiment of a single-node repeater in which the power amplifier limiting and protection techniques are implemented.

Repeater systems can be implemented in other ways. For example, a repeater system can be implemented as a single-node repeater. FIG. 5 illustrates a block diagram of one embodiment of a single-node repeater 500 in which the power amplifier limiting and protection system techniques described herein are implemented.

The single-node repeater 500 is configured to facilitate wireless communications between one or more base stations 503 and user equipment 514 (e.g. a mobile phone, tablet, or computer). Such wireless communication can be through uplink repeater circuitry 520 to the base station(s) 503 and a downlink repeater circuitry 512 to the user equipment 514.

The single-node repeater 500 comprises the downlink repeater circuitry 512 that is configured to receive one or more downlink signals from the one or more base stations 503. These signals are also referred to here as "base station downlink signals." Each base station downlink signal includes one or more radio frequency channels used for communicating in the downlink direction with user equipment (UE) 514 over the relevant wireless air interface. Typically, each base station downlink signal is received as an analog radio frequency signal.

The downlink repeater circuitry 512 in the single-node repeater 500 is also configured to generate one or more downlink radio frequency signals that are radiated from one or more antennas 515 associated with the single-node repeater 500 for reception by user equipment 514. These downlink radio frequency signals are analog radio frequency signals and are also referred to here as "repeated downlink radio frequency signals." Each repeated downlink radio frequency signal includes one or more of the downlink radio frequency channels used for communicating with user equipment 514 over the wireless air interface. In this exemplary embodiment, the single-node repeater 500 is an active repeater system in which the downlink repeater circuitry 512 comprises one or more amplifiers (or other gain elements) that are used to control and adjust the gain of the repeated downlink radio frequency signals radiated from the one or more antennas 515. The downlink repeater circuitry 512 includes at least one transmitter front end having a power amplifier limiting and protection system 519 which, for example, power amplifies the repeated downlink radio frequency signals.

Also, the single-node repeater 500 comprises uplink repeater circuitry 520 that is configured to receive one or more uplink radio frequency signals transmitted from the user equipment 514. These signals are analog radio frequency signals and are also referred to here as "UE uplink radio frequency signals." Each UE uplink radio frequency signal includes one or more radio frequency channels used for communicating in the uplink direction with user equipment 514 over the relevant wireless air interface.

The uplink repeater circuitry 520 in the single-node repeater 500 is also configured to generate one or more uplink radio frequency signals that are provided to the one or more base stations 503. These signals are also referred to here as "repeated uplink signals." Each repeated uplink signal includes one or more of the uplink radio frequency channels used for communicating with user equipment 514 over the wireless air interface. In this exemplary embodiment, the single-node repeater 500 is an active repeater system in which the uplink repeater circuitry 520 comprises one or more amplifiers (or other gain elements) that are used to control and adjust the gain of the repeated uplink radio frequency signals provided to the one or more base stations 503. Typically, each repeated uplink signal is provided to the one or more base stations 503 as an analog radio frequency signal. The uplink repeater circuitry 520 may include at least one receiver front end which e.g. amplifies received uplink radio frequency signals.

The downlink repeater circuitry 512 and uplink repeater circuitry 520 can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink repeater circuitry 512 and uplink repeater circuitry 520 may share common circuitry and/or components.

The at least one transmitter front end 519 includes at least one of the transmitter front end having a power amplifier limiting and protection system 100 described above. Further, a combination of two or more diplexers, duplexers, transmit/receive switches duplexers and/or other combiner systems can be used to couple the downlink DAS circuitry 512 (e.g. including the at least one transmitter front end 519) and the uplink DAS circuitry 520 to one or more antennas 515. The single-node repeater system 500 also comprises a controller (CNTRL) 521. The controller 721 is implemented using one or more programmable processors that execute software that is configured to implement the various control functions. The controller 521 (more specifically, the various control functions implemented by the controller 521) (or portions thereof) can be implemented in other ways (for example, in a field programmable gate array (FPGA), application specific integrated circuit (ASIC), etc.). The components of the power amplifier limiting and protection system 100, e.g. the power control processing circuitry 110 or a portion thereof, may be incorporated, e.g. in the controller 521 of the single-node repeater system 700.

Figure 6:
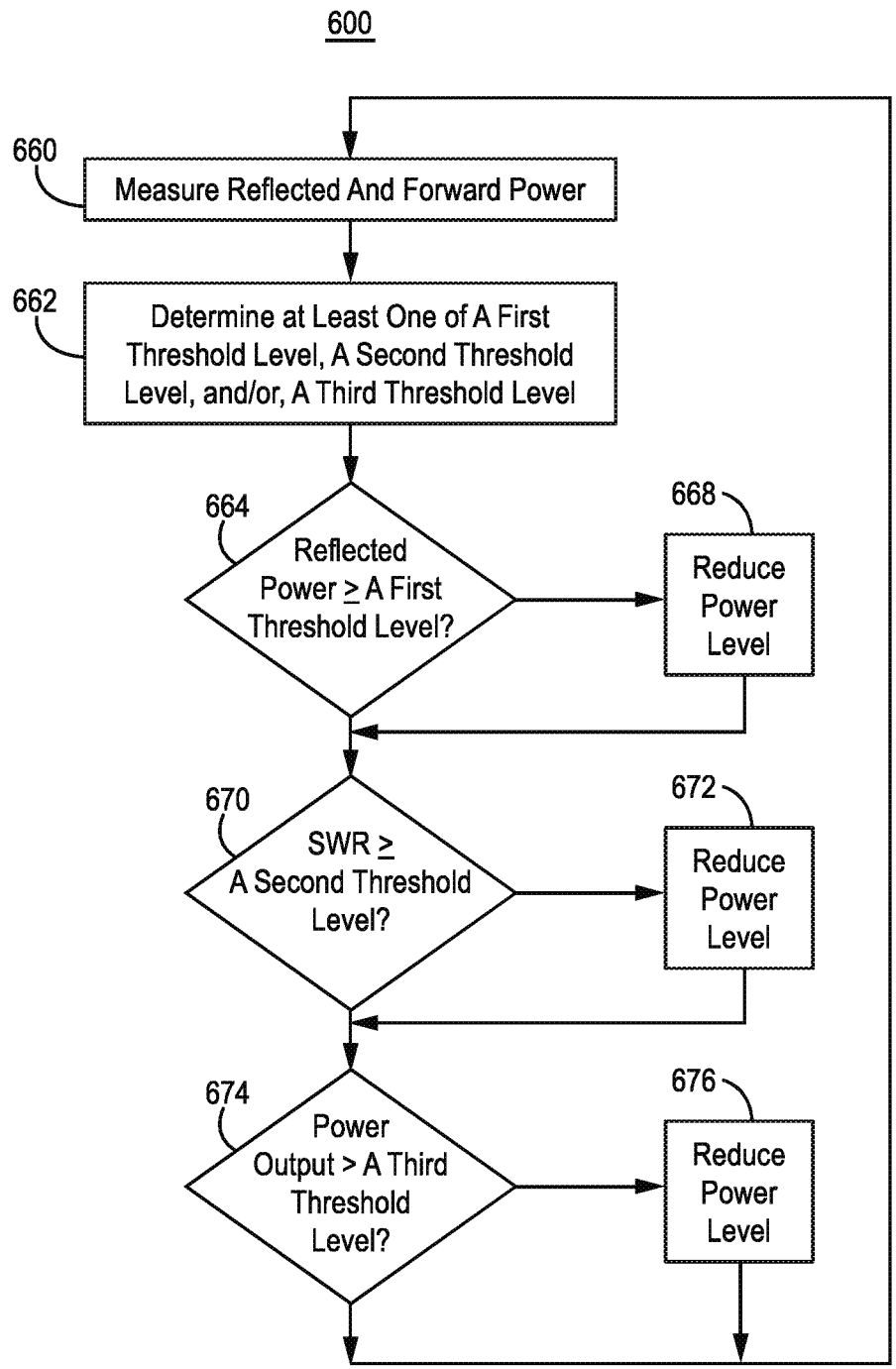
FIG. 6 illustrates a flow diagram of one embodiment of a method of power amplifier limiting and protection.

FIG. 6 illustrates a flow diagram of one embodiment of a method of power amplifier limiting and protection 600. To the extent that the embodiment of method 600 shown in FIG. 6 is described herein as being implemented in the systems described with respect to FIGS. 1-5, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 660, measure reflected power and forward power at the output of a power amplifier. Optionally, to protect the power amplifier from damage, increase attenuation or reduce gain at the input of the power amplifier during a first time period after DC power is provided to the power amplifier. Optionally, in block 662, determine at least one of a first threshold level, a second threshold level, and a third threshold level, e.g. based upon measured parameter(s) for example ambient temperature of the power amplifier, forward power, and/or reverse power.

In block 664 determine if the reflected power is equal to or exceeds a first threshold level. If the reflected power level is equal to or exceeds a first threshold level, then in block 668 reduce power level of a signal at an input of the power amplifier. Subsequently, proceed to block 670. If the reflected power level is not equal to or does not exceed the first threshold level, then proceed to block 670.

Optionally, determine if block 668 had been performed; if block 668 had been performed, then delay (for a time period) performing at least one of block 670 and block 672. Also, optionally, reduce the power level of the signal at the input of the power amplifier by fifty percent or more, by seventy five percent or more, or by ninety nine percent or more, e.g. by adjusting the power control system 102. This prevents the power amplifier from being damaged in a short period of time. Further, optionally, the first threshold level may vary as a function of one or more parameters, e.g. temperature.

In block 670, determine if a standing wave ratio at the output of the power amplifier is equal to or exceeds a second threshold level. If the standing wave ratio at the output of the power amplifier is equal to or exceeds the second threshold level, then in block 672 reduce the power level of the signal at the input of the power amplifier and/or provide an alarm indicating the high standing wave ratio. Optionally, reduce the power level of the signal at the input of the power amplifier by twenty five percent or more, by fifty percent or more, or by seventy five percent or more. Optionally, the percentage reduction of the power level of the input signal due to the standing wave ratio at the output of the power amplifier being equal to or exceeding the second threshold level is less than the percentage reduction of power level of the input signal due to the level of reflected power equaling or exceeding the first threshold level. The alarm may be a message or signal sent to a network operator and/or an indicator (for example a flashing light, e.g. an LED, and/or a sound produced from a speaker) in the corresponding transmitter front end having a power amplifier limiting and protection system 100 to identify the faulty part to maintenance personnel.

Optionally, only noise (rather than actual signals for transmission) is provided at the input of the power amplifier 104, and the power of the noise is used to generate the forward power and therefore reverse power, and thus determine the standing wave ratio. Noise can be provided during diagnostic testing of the transmitter front end having a power amplifier limiting and protection system 100. Noise may be provided by a low power noise source or from the inherent operation of the transmitter that is coupled to the input of the transmitter front end having a power amplifier limiting and protection system 100. Because the power level of the noise is low, there is low or no risk of reflected power damaging the power amplifier 104.

Subsequently, proceed to block 674. If the standing wave ratio at the output of the power amplifier does not equal or does not exceed the second threshold level, then proceed to block 674.

In block 674, determine if the power output from the power amplifier, or forward power, is equal to or exceeds a third threshold level. If the power output from the power amplifier is equal to or exceeds the third threshold level, then in block 676 reduce the power level of the signal at the input of the power amplifier until the power output from the power amplifier is less than or equal to the third threshold power level, and/or provide an alarm indicating the automatic limiting control function has been enabled. The alarm may be a message or signal sent to a network operator and/or an indicator, such as a flashing light, e.g. an LED, in the corresponding transmitter front end having a power amplifier limiting and protection system 100 to identify the faulty part to maintenance personnel. Subsequently, proceed to block 660. If the power output from the power amplifier does not equal or exceed the third threshold, then proceed to block 660.

The processor circuitry described herein may include one or more microprocessors, microcontrollers, digital signal processing (DSP) elements, application-specific integrated circuits (ASICs), complex programmable logic devices, and/or field programmable gate arrays (FPGAs). In this exemplary embodiment, processor circuitry includes or functions with software programs, firmware, or other computer readable instructions for carrying out various process tasks, calculations, and control functions, used in the methods described herein. These instructions are typically tangibly embodied on any storage media (or computer readable medium) used for storage of computer readable instructions or data structures.

The memory circuitry described herein can be implemented with any available storage media (or computer readable media) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk-Read Only Memory (CD-ROM), DVDs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory. Combinations of the above are also included within the scope of computer readable media.

Exemplary Embodiments

Example 1 includes a method, comprising: measuring reflected power and forward power at an output of a power amplifier; determining if the reflected power is equal to or exceeds a first threshold level; if the reflected power is equal to or exceeds the first threshold level, then reduce power level of a signal at an input of the power amplifier; determining if a standing wave ratio at the output of the power amplifier equals or exceeds a second threshold level; if the standing wave ratio at the output of the power amplifier equals or exceeds the second threshold level, then perform at least one of: (a) reduce the power level of the signal at the input of the power amplifier, and (b) send an alarm; determining if the power output from the power amplifier is equal to or exceeds a third threshold level; and if the power output from the power amplifier is equal to or exceeds the third threshold level, then perform at least one of: (a) reduce the power level of the signal at the input of the power amplifier until such power level is less than or equal to the third threshold, and (b) send an alarm.

Example 2 includes the method of Example 1, further comprising increasing attenuation or decreasing gain at the input of the power amplifier for a first time period after DC power is supplied to the power amplifier.

Example 3 includes the method of any of Examples 1-2, further comprising determining, based upon at least one measured parameter, at least one of: a first threshold level, a second level, and a third level.

Example 4 includes the method of any of Examples 1-3, further comprising: determining if the power level of the signal at the input of the power amplifier had been reduced due to high reflected power; if the power level of the signal at the input of the power amplifier had been reduced due to high reflected power, then delay performing at least one of: (a) determining if the standing wave ratio at the output of the power amplifier is equal to or exceeds the second threshold level, and (b) reduction, of the power level of the signal at the input of the power amplifier, due to the standing wave ratio being equal to or exceeding the second threshold level.

Example 5 includes the method of any of Examples 1-4, further comprising providing noise at the input of the power amplifier to determine the standing wave ratio.

Example 6 includes the method of any of Examples 1-5, wherein the alarm comprises at least one of: (a) a message or signal sent to a network operator; and (b) an indicator in a corresponding transmitter front end having a power amplifier limiting and protection system.

Example 7 includes a system, comprising: a power control system having an input and an output; at least one coupler having an input port, an output port, a forward coupled port, and a reverse coupled port; a power amplifier having an input coupled to the output of the power control system, and an output coupled to the input port of the at least one coupler; power detector circuitry having at least one input coupled to the forward coupled port and the reverse coupled port, and at least one output; power control processing circuitry having at least one input coupled to the at least one output of the power detector circuitry, and an output coupled the input of the power control system; and wherein the power control processing circuitry is configured to: determine if the reflected power is equal to or exceeds a first threshold level; if the reflected power is equal to or exceeds the first threshold level, then cause the power control system to reduce a power level of a signal at an input of the power amplifier; determine if a standing wave ratio at the output of the power amplifier equals or exceeds a second threshold level; if the standing wave ratio at the output of the power amplifier equals or exceeds the second threshold level, then perform at least one of: (a) cause the power control system to reduce the power level of the signal at the input of the power amplifier, and (b) send an alarm; determine if the power output from the power amplifier is equal to or exceeds a third threshold level; and if the power output from the power amplifier is equal to or exceeds the third threshold level, then perform at least one of: (a) cause the power control system to reduce the power level of the signal at the input of the power amplifier until such power level is less than or equal to the third threshold, and (b) send an alarm.

Example 8 includes the system of Example 7, wherein the power control processing circuitry is further configured to increase attenuation or decrease gain in the power control system for a first time period after DC power is supplied to the power amplifier.

Example 9 includes the system of any of Examples 7-8, wherein the power control processing circuitry is further configured to determine, based upon at least one measured parameter, at least one of a first threshold level, a second level, and a third level.

Example 10 includes the system of any of Examples 7-9, wherein the power control processing circuitry is further configured to delay at least one of (a) determining if the standing wave ratio at the output of the power amplifier is equal to or exceeds the second threshold level, and (b) reduction, of the power level of the signal at the input of the power amplifier, due to the standing wave ratio being equal to or exceeding the second threshold level.

Example 11 includes the system of any of Examples 7-10, further comprising at least one sensor coupled to the power control processing circuitry.

Example 12 includes the system of Example 11, wherein at least one of the at least one sensor is a temperature sensor.

Example 13 includes the system of any of Examples 7-12, wherein the power control processing circuitry is further configured to determine the standing wave ratio when only noise is provided at the input of the power amplifier.

Example 14 includes the system of any of Examples 7-13, wherein the alarm comprises at least one of: (a) a message or signal sent to a network operator; and an indicator identifying the system.

Example 15 includes the system of any of Examples 8-14, wherein a forward signal and a reverse signal are provided at the at least one output of the power detector circuitry; wherein the power control processing circuitry comprises: a processing system having at least one input coupled to the at least one output of the power detector circuitry and configured to receive the forward signal and the reverse signal; wherein the processing system is configured to provide a first threshold level and a first control signal; wherein the first control signal varies based upon whether the standing wave ratio at the output of the power amplifier equals or exceeds a second threshold level, and whether the power output from the power amplifier is equal to or exceeds the third threshold level; wherein the first control signal is configured to cause the power control system to vary a power level of a signal at the input of the power amplifier; a comparator having an output, a first input configured to receive the reverse signal, and a second input configure to receive the first threshold level; a switch having a control port coupled to the output of the comparator, and a first port coupled to the input of the power control system; wherein the comparator is configured to cause the switch to change states when the reflected power exceeds the first threshold level and the switch to generate a second control signal; and wherein the second control signal is configured to cause the power control system to reduce the power level of the signal at the input of the power amplifier; and wherein the input of the power control system is coupled to the power control processing circuitry and is configured to receive the first control signal and the second control signal.

Example 16 includes the system of Example 15, wherein the power control processing circuitry further comprises a delay circuit: (a) coupled to the processing system and configured to receive the first control signal, (b) coupled to the first port of the switch and configured to receive the second control signal, and (c) coupled to the input of the power control system.

Example 17 includes the system of any of Examples 15-16, wherein the power control processing circuitry further comprises an amplifier having an input coupled to the processing system and configured to receive the first control signal, and an output coupled to the power control system and the first port of the switch.

Example 18 includes the system of any of Examples 7-17, wherein system comprises one of a remote antenna unit of a distributed antenna system and a single-node repeater.

Example 19 includes a system, comprising: a power control system having an input and an output; at least one coupler having an input port, an output port, a forward coupled port, and a reverse coupled port; a power amplifier having an input coupled to the output of the power control system, and an output coupled to the input port of the at least one coupler; power detector circuitry having at least one input coupled to the forward coupled port and the reverse coupled port, and at least one output; wherein a forward signal and a reverse signal are provided at the at least one output of the power detector circuitry; a processing system, comprising processing circuitry coupled to memory circuitry, having at least one input coupled to the at least one output of the power detector circuitry and configured to receive the forward signal and the reverse signal; wherein the processing system is configured to provide a first threshold level and a first control signal; wherein the input of the power control system is coupled to the processing system and is configured to receive the first control signal; wherein the first control signal varies based upon whether a standing wave ratio at the output of the power amplifier equals or exceeds a second threshold level, and whether the power output from the power amplifier is equal to or exceeds the third threshold level; wherein the first control signal is configured to cause the power control system to vary a power level of a signal at the input of the power amplifier; a comparator having an output, a first input configured to receive the reverse signal, and a second input configure to receive the first threshold level; a switch having a control port coupled to the output of the comparator, and a first port coupled to the input of the power control system; wherein the comparator is configured to cause the switch to change states when the reflected power exceeds the first threshold level and the switch to generate a second control signal; and wherein the second control signal is configured to cause the power control system to reduce the power level of the signal at the input of the power amplifier.

Example 20 includes the system of Example 19, wherein the power control processing circuitry further comprises a delay circuit coupled to (a) the processing system and configured to receive the second control signal, (b) the first port of the switch, and (c) the input of the power control system.

Example 21 includes the system of Example 20, wherein the delay circuit comprises: a resistor having a first port and a second port, wherein the first port of the resistor is coupled to the processing system and is configured to receive the control signal; a capacitor having a port coupled to the second port of the resistor and the first port of the switch.

Example 22 includes the system of any of Examples 19-21, further comprising an amplifier having an input coupled to the processing system and configured to receive the first control signal, and an output coupled to the power control system and the first port of the switch.

Example 23 includes the system of any of Examples 19-22, wherein system comprises one of a remote antenna unit of a distributed antenna system and a single-node repeater.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims. Therefore, it is manifestly intended that this invention be limited only by the claims and the equivalents thereof.

The invention claimed is:
1. A method, comprising:
measuring reflected power at an output of a power amplifier;
determining if the reflected power is equal to or exceeds a first threshold level;
if the reflected power is equal to or exceeds the first threshold level, then reducing a power level of a signal at an input of the power amplifier;
determining if a standing wave ratio at the output of the power amplifier equals or exceeds a second threshold level;
if the standing wave ratio at the output of the power amplifier equals or exceeds the second threshold level, then performing at least one of: (a) reducing the power level of the signal at the input of the power amplifier, and (b) sending an alarm;
determining if power output from the power amplifier is equal to or exceeds a third threshold level; and
if the power output from the power amplifier is equal to or exceeds the third threshold level, then performing at least one of: (a) reducing the power level of the signal at the input of the power amplifier until a power level at the output of the power amplifier is less than or equal to the third threshold level, and (b) sending an alarm.

2. The method of claim 1, further comprising increasing attenuation or decreasing gain at the input of the power amplifier for a first time period after DC power is supplied to the power amplifier.

3. The method of claim 1, further comprising determining, based upon at least one measured parameter, at least one of: the first threshold level, the second threshold level, and the third threshold level.

4. The method of claim 1, further comprising:
if the reflected power is equal to or exceeds the first threshold level, then delay performing at least one of: (a) determining if the standing wave ratio at the output of the power amplifier is equal to or exceeds the second threshold level, and (b) reducing the power level of the signal at the input of the power amplifier.

5. The method of claim 1, further comprising providing noise at the input of the power amplifier to determine the standing wave ratio.

6. The method of claim 1, wherein the alarm comprises at least one of: (a) a message or signal sent to a network operator and (b) an indicator in a corresponding transmitter front end.

7. A system, comprising:
a power control system comprising an input and an output;
at least one coupler comprising an input port, an output port, and a reverse coupled port;
a power amplifier comprising an input coupled to the output of the power control system, and an output coupled to the input port of the at least one coupler;
power detector circuitry comprising at least one input coupled to the reverse coupled port, and at least one output; and
power control processing circuitry comprising at least one input coupled to the at least one output of the power detector circuitry, and an output coupled the input of the power control system;
wherein the power control processing circuitry is configured to:
determine if reflected power is equal to or exceeds a first threshold level, wherein the reflected power is a portion of power incident upon the output port;
if the reflected power is equal to or exceeds the first threshold level, then cause the power control system to reduce a power level of a signal at the input of the power amplifier;
determine if a standing wave ratio at the output of the power amplifier equals or exceeds a second threshold level;
if the standing wave ratio at the output of the power amplifier equals or exceeds the second threshold level, then perform at least one of: (a) cause the power control system to reduce the power level of the signal at the input of the power amplifier, and (b) send an alarm;
determine if power output from the power amplifier is equal to or exceeds a third threshold level; and
if the power output from the power amplifier is equal to or exceeds the third threshold level, then perform at least one of: (a) cause the power control system to reduce the power level of the signal at the input of the power amplifier until the power level at the output of the power amplifier is less than or equal to the third threshold level, and (b) send an alarm.

8. The system of claim 7, wherein the power control processing circuitry is further configured to increase attenuation or decrease gain in the power control system for a first time period after DC power is supplied to the power amplifier.

9. The system of claim 7, wherein the power control processing circuitry is further configured to determine, based upon at least one measured parameter, at least one of: the first threshold level, the second threshold level, and the third threshold level.

10. The system of claim 7, wherein the power control processing circuitry is further configured to delay at least one of (a) determining if the standing wave ratio at the output of the power amplifier is equal to or exceeds the second threshold level, and (b) reducing the power level of the signal at the input of the power amplifier if the reflected power is equal to or exceeds the first threshold level.

11. The system of claim 7, further comprising at least one sensor coupled to the power control processing circuitry and configured to measure an environmental parameter.

12. The system of claim 11, wherein at least one of the at least one sensor is a temperature sensor.

13. The system of claim 7, wherein the power control processing circuitry is further configured to determine the standing wave ratio when only noise is provided at the input of the power amplifier.

14. The system of claim 7, wherein the alarm comprises at least one of: (a) a message or signal sent to a network operator and (b) an indicator identifying the system.

15. The system of claim 8,
wherein a forward signal and a reverse signal are provided at the at least one output of the power detector circuitry;
wherein the power control processing circuitry comprises:
second processing circuitry comprising at least one input coupled to the at least one output of the power detector circuitry and configured to receive the forward signal and the reverse signal;
wherein the second processing circuitry is configured to generate the first threshold level and a first control signal;
wherein the first control signal varies based upon whether the standing wave ratio at the output of the power amplifier equals or exceeds the second threshold level, and whether power output from the power amplifier is equal to or exceeds the third threshold level;
wherein the first control signal is configured to cause the power control system to vary the power level of the signal at the input of the power amplifier;
a comparator comprising an output, a first input configured to receive the reverse signal, and a second input configure to receive the first threshold level;
a switch comprising a control port coupled to the output of the comparator, and a first port coupled to the input of the power control system;
wherein the comparator is configured to cause the switch to change states when the reflected power exceeds the first threshold level and the switch to generate a second control signal; and
wherein the second control signal is configured to cause the power control system to reduce the power level of the signal at the input of the power amplifier;
wherein the input of the power control system is coupled to the power control processing circuitry and is configured to receive the first control signal and the second control signal.

16. The system of claim 15, wherein the power control processing circuitry further comprises a delay circuit: (a) coupled to the second processing circuitry and configured to receive the first control signal, (b) coupled to the first port of the switch and configured to receive the second control signal, and (c) coupled to the input of the power control system.

17. The system of claim 15, wherein the power control processing circuitry further comprises an amplifier comprising an input coupled to the second processing circuitry and configured to receive the first control signal, and an output coupled to the power control system and the first port of the switch.

18. The system of claim 7, wherein system comprises one of a remote antenna unit of a distributed antenna system and a single-node repeater.

19. A system, comprising:
a power control system comprising an input and an output;
at least one coupler comprising an input port, an output port, a forward coupled port, and a reverse coupled port;
a power amplifier comprising an input coupled to the output of the power control system, and an output coupled to the input port of the at least one coupler;
power detector circuitry comprising at least one input coupled to the forward coupled port and the reverse coupled port, and at least one output;
wherein a forward signal and a reverse signal are provided at the at least one output of the power detector circuitry;
power control processing circuitry, comprising at least one input coupled to the at least one output of the power detector circuitry and configured to receive the forward signal and the reverse signal;
wherein the power control processing circuitry is configured to generate a first threshold level and a first control signal;
wherein the input of the power control system is coupled to the power control processing circuitry and is configured to receive the first control signal;
wherein the first control signal varies based upon whether a standing wave ratio at the output of the power amplifier equals or exceeds a second threshold level, and whether power output from the power amplifier is equal to or exceeds a third threshold level;
wherein the first control signal is configured to cause the power control system to vary a power level of a signal at the input of the power amplifier;
a comparator comprising an output, a first input configured to receive the reverse signal, and a second input configure to receive the first threshold level;
a switch comprising a control port coupled to the output of the comparator, and a first port coupled to the input of the power control system; and
wherein the comparator is configured to cause the switch to change states when reflected power exceeds the first threshold level and the switch to generate a second control signal, wherein the reflected power is a portion of power incident upon the output port;
wherein the second control signal is configured to cause the power control system to reduce the power level of the signal at the input of the power amplifier.

20. The system of claim 19, wherein the power control processing circuitry further comprises second processing circuitry and a delay circuit coupled to (a) the second processing circuitry and configured to receive the second control signal, (b) the first port of the switch, and (c) the input of the power control system.

21. The system of claim 20, wherein the delay circuit comprises:
a resistor comprising a first port and a second port, wherein the first port of the resistor is coupled to the second processing circuitry and is configured to receive the second control signal; and
a capacitor comprising a port coupled to the second port of the resistor and the first port of the switch.

22. The system of claim 20, further comprising an amplifier comprising an input coupled to the second processing circuitry and configured to receive the second control signal, and an output coupled to the power control system and the first port of the switch.

23. The system of claim 19, wherein system comprises one of a remote antenna unit of a distributed antenna system and a single-node repeater.

24. The method of claim 1, further comprising determining a forward power.

25. The method of claim 24, further comprising determining the standing wave ratio using a signal indicative of the forward power and a signal indicative of the reflected power.

26. The method of claim 24, wherein determining the forward power comprises measuring the forward power at an output of the power amplifier.

27. The system of claim 7, wherein the at least one input of the power control processing circuitry is configured to receive a signal indicative of a forward power.

28. The system of claim 27, wherein the power control processing circuitry is further configured to determine the standing wave ratio using a signal indicative of the reflected power and the signal indicative of the forward power.

29. The system of claim 27, wherein the at least one coupler further comprises a forward coupled port coupled to the at least one input.

* * * * *